(12) United States Patent
Iwata et al.

(10) Patent No.: US 8,059,080 B2
(45) Date of Patent: Nov. 15, 2011

(54) SEMICONDUCTOR STORAGE UNIT, SEMICONDUCTOR DEVICE AND DISPLAY DEVICE AS WELL AS LIQUID CRYSTAL DISPLAY AND IMAGE RECEIVING APPARATUS

(75) Inventors: Hiroshi Iwata, Nara (JP); Akihide Shibata, Nara (JP); Kohichiro Adachi, Tenri (JP); Masayuki Nakano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1023 days.

(21) Appl. No.: 11/945,129

(22) Filed: Nov. 26, 2007

(65) Prior Publication Data

US 2008/0136757 A1    Jun. 12, 2008

(30) Foreign Application Priority Data

Nov. 27, 2006 (JP) ................. 2006-318719

(51) Int. Cl.
*G09G 3/34* (2006.01)
(52) U.S. Cl. ............................................. 345/98
(58) Field of Classification Search ............. 345/98
See application file for complete search history.

(56) References Cited

U.S. PATENT DOCUMENTS

| | | | | |
|---|---|---|---|---|
| 4,376,672 A * | 3/1983 | Wang et al. | ........ | 438/713 |
| 6,432,843 B1 * | 8/2002 | Kim et al. | ........ | 438/782 |
| 7,180,095 B2 * | 2/2007 | Kamo et al. | ........ | 257/72 |
| 7,425,931 B1 * | 9/2008 | Yamazaki et al. | ........ | 345/7 |
| 7,564,291 B2 * | 7/2009 | Cantatore | ........ | 327/365 |
| 7,791,571 B2 * | 9/2010 | Ohtani et al. | ........ | 345/82 |
| 2001/0006843 A1 * | 7/2001 | Park | ........ | 438/591 |
| 2001/0013853 A1 * | 8/2001 | Suzuki | ........ | 345/92 |
| 2001/0019158 A1 * | 9/2001 | Tsujikawa et al. | ........ | 257/369 |
| 2001/0025998 A1 * | 10/2001 | Tsuchiaki | ........ | 257/402 |
| 2001/0048147 A1 * | 12/2001 | Mizuhara et al. | ........ | 257/642 |
| 2002/0160622 A1 * | 10/2002 | Yamazaki et al. | ........ | 438/762 |
| 2004/0175873 A1 * | 9/2004 | Yamazaki et al. | ........ | 438/164 |
| 2006/0199371 A1 * | 9/2006 | Mizuhara et al. | ........ | 438/624 |
| 2007/0001945 A1 * | 1/2007 | Yoshida et al. | ........ | 345/87 |

FOREIGN PATENT DOCUMENTS

| | | |
|---|---|---|
| JP | HEI 4-754 | 1/1992 |
| JP | 11-87545 A | 3/1999 |
| JP | 2000-294662 A | 10/2000 |
| JP | 2001-351995 A | 12/2001 |
| JP | 2003-243620 A | 8/2003 |
| JP | 2005-79186 A | 3/2005 |
| JP | 2006-065995 A | 3/2006 |
| JP | 2006-236556 A | 9/2006 |

* cited by examiner

*Primary Examiner* — Richard Hjerpe
*Assistant Examiner* — Jeffrey Parker
(74) *Attorney, Agent, or Firm* — Birch, Stewart, Kolasch & Birch, LLP

(57) ABSTRACT

To provide a semiconductor storage unit that has a simple structure requiring only a small number of processes to produce, and is provided with a gate insulating film having a memory function. The semiconductor storage unit has a semiconductor layer, two diffusion layer regions forming a source region and a drain region, which are formed on the semiconductor layer, a channel region fixed between the two diffusion layer regions, a gate insulating film that is formed on the channel region, and made of a silicon oxide film containing carbon atoms of 0.1 to 5.0 atomic percent, and a gate electrode formed on the gate insulating film.

11 Claims, 18 Drawing Sheets

SEMICONDUCTOR STORAGE UNIT, SEMICONDUCTOR DEVICE AND DISPLAY DEVICE AS WELL AS LIQUID CRYSTAL DISPLAY AND IMAGE RECEIVING APPARATUS

CROSS-REFERENCE TO RELATED APPLICATION

This application is related to Japanese Patent Application No. 2006-318719 filed on Nov. 27, 2006, whose priority is claimed under 35 USC §119, the disclosure of which is incorporated by reference in its entirety.

BACKGROUND OF THE INVENTION

1. Field of the Invention

This invention relates to a semiconductor storage unit, a semiconductor device and a display device as well as to a liquid crystal display and an image receiving apparatus. More specifically, the present invention concerns a semiconductor storage unit that accumulates a charge in an insulating material having a level capable of trapping a charge, a semiconductor device and a display device provided with such a semiconductor storage unit, as well as a liquid crystal display and an image receiving apparatus.

2. Description of the Related Art

Conventionally, a non-volatile memory using a silicon nitride film has been proposed as a non-volatile memory to be formed on an insulating substrate such as a glass substrate. Examples of such a non-volatile memory include a semiconductor non-volatile storage unit disclosed in JP-A No. 11-87545. FIG. 22 shows the semiconductor storage unit disclosed in JP-A No. 11-87545, and in this drawing, reference numeral 901 represents an insulating substrate, 902 is a base insulating film, 911 is a semiconductor layer, 921 is a bottom insulating film, 922 is a charge trap insulating film (silicon nitride), 923 is a top insulating film, and 931 is a control gate. In this structure, a gate insulating film functioning as a memory storage unit has an ONO (Oxide-Nitride-Oxide) structure. A rewriting process of stored information is carried out by injecting a charge from the semiconductor layer 911 to the charge trap insulating film 922. Depending on the quantity of charge accumulated in the charge trap insulating film 922, the threshold value of a memory element serving as a field effect transistor changes. By detecting this change in the threshold value, the reading process of the stored information is carried out.

Moreover, JP-A No. 2000-294662 has disclosed a non-volatile semiconductor memory element in which a gate insulating film and a gate electrode are formed on a semiconductor layer having a channel region, and source and drain regions to construct a transistor so that a charge is injected into the gate insulating film. This memory element is characterized in that an oxide of a gate electrode material is formed on the surface of the gate electrode so that a compression stress is applied to the interface of the gate insulating film.

However, the semiconductor non-volatile storage unit disclosed in JP-A No. 11-87545 is designed so that the gate insulating film has a three-layer structure (ONO structure) in which upper and lower insulating films (the bottom insulating film 921 and the top insulating film 923) sandwich the charge trap insulating film 922, and this structure causes a problem in that the number of processes increases so as to form the gate insulating film. Moreover, the non-volatile semiconductor memory element described in JP-A No. 2000-294662 needs to form an oxide of the gate electrode material on the surface of the gate so as to apply a compression stress to the interface of the gate insulating film.

SUMMARY OF THE INVENTION

The present invention has been devised to solve these problems, and its objective is to provide a semiconductor storage unit that has a simple structure so that the number of processes required for forming the semiconductor storage unit can be reduced, and is provided with a gate insulating film having a memory function. Moreover, another objective is to provide a semiconductor device and display device having such a semiconductor storage unit, as well as a liquid crystal display and an image receiving apparatus.

In order to solve the above-mentioned problem, a semiconductor storage unit in accordance with the first aspect of the present invention is provided with a semiconductor layer; two diffusion layer regions forming a source region and a drain region, which are formed in the semiconductor layer; a channel region fixed between the two diffusion layer regions; a gate insulating film that is formed on the channel region, and made of a silicon oxide film containing carbon atoms of 0.1 to 5.0 atomic percent; and a gate electrode formed on the gate insulating film.

In accordance with the above-mentioned structure, the gate insulating film, which functions as a memory storage unit, is made of a silicon oxide film containing carbon atoms of 0.1 to 5.0 atomic percent, which can be utilized as a non-volatile memory. In comparison with the conventional semiconductor storage unit in which the gate insulating film of the ONO structure using a silicon nitride film is used as the memory storage unit, the structure of the element is simplified so that the number of processes required for forming the semiconductor storage unit can be reduced.

DESCRIPTION OF THE PREFERRED EMBODIMENTS

First Embodiment

Figure 1:
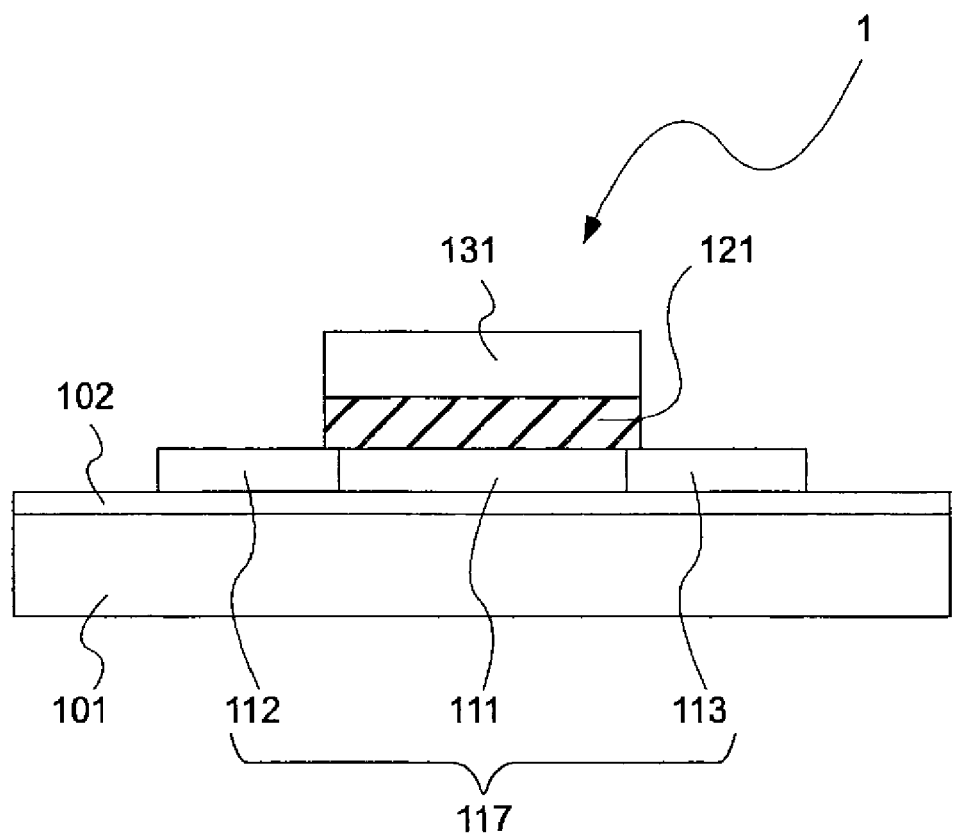
FIG. 1 is a schematic cross-sectional view that shows a storage unit in accordance with first Embodiment of the present invention.

In accordance with the first aspect of the present invention, a semiconductor storage unit relating to first Embodiment is characterized by including a semiconductor layer, two diffusion layer regions forming a source region and a drain region, which are formed in the semiconductor layer, a channel region fixed between the two diffusion layer regions, a gate insulating film that is formed on the channel region, and made of a silicon oxide film containing carbon atoms in a range from 0.1 to 5.0 atomic percent and a gate electrode formed on the gate insulating film.

In one Embodiment of the semiconductor storage unit in accordance with the first aspect of the present invention, the two diffusion layer regions are P-type conductive regions and designed so that by accumulating holes in the gate insulating film, a current flowing between the two diffusion layer regions can be reduced.

In accordance with this Embodiment, the semiconductor storage unit is of the P-channel type, and a writing speed can be improved in comparison with that of the N-channel type. In a non-volatile memory formed by a normal LSI process, the memory is preferably prepared as the N-channel type, and actually, N-channel-type elements are used in most cases; however, the semiconductor storage unit of the present invention is preferably prepared as the P-channel type.

Moreover, in another Embodiment of the semiconductor storage unit in accordance with the first aspect of the present invention, the two diffusion layer regions are N-type conductive regions, and designed so that by applying a reference voltage to one of the diffusion layer regions, with a voltage higher than the reference voltage being applied to the other diffusion layer region and a voltage higher than the reference voltage being applied to the gate electrode, electrons are locally injected into the gate insulating film on the other diffusion region side so as to reduce a current flowing between the two diffusion layer regions.

In accordance with the above-mentioned Embodiment, since the writing voltage can be greatly lowered, the margin of the writing voltage for the voltage resistance of the gate insulating film can be made much greater. Therefore, the reliability of the semiconductor storage unit can be improved.

Moreover, in still another Embodiment of the semiconductor storage unit in accordance with the first aspect of the present invention, the two diffusion layer regions are P-type conductive regions, and designed so that by applying a reference voltage to one of the diffusion layer regions, with a voltage lower than the reference voltage being applied to the other diffusion layer region and a voltage lower than the reference voltage being applied to the gate electrode, holes are locally injected into the gate insulating film on the other diffusion region side so as to reduce a current flowing between the two diffusion layer regions.

In accordance with this Embodiment also, since the writing voltage is greatly lowered, the margin of the writing voltage for the voltage resistance of the gate insulating film can be made much greater. Therefore, the reliability of the semiconductor storage unit can be improved.

Furthermore, in still another Embodiment of the semiconductor storage unit in accordance with the first aspect of the present invention, the two diffusion layer regions are N-type conductive regions, and designed so that by applying a reference voltage to one of the diffusion layer regions, with a voltage higher than the reference voltage being applied to the other diffusion layer region and a voltage lower than the reference voltage being applied to the gate electrode, holes are locally injected into the gate insulating film on the other diffusion region side so as to increase a current flowing between the two diffusion layer regions.

In accordance with this Embodiment also, since the erasing voltage can be greatly lowered, the margin of the erasing voltage for the voltage resistance of the gate insulating film can be made much greater. Therefore, the reliability of the semiconductor storage unit can be improved.

In still another Embodiment of the semiconductor storage unit in accordance with the first aspect of the present invention, the semiconductor layer is provided with a body region placed between the two diffusion layers, and a voltage lower than the reference voltage is applied to the body region.

In accordance with this Embodiment, it becomes possible to make the erasing speed faster by the use of a lower erasing voltage.

Moreover, in this Embodiment of the semiconductor storage unit in accordance with the first aspect of the present invention, the two diffusion layer regions are P-type conductive regions, and designed so that by applying a reference voltage to one of the diffusion layer regions, with a voltage lower than the reference voltage being applied to the other diffusion layer region and a voltage higher than the reference voltage being applied to the gate electrode, electrons are locally injected into the gate insulating film on the other diffusion region side so as to increase a current flowing between the two diffusion layer regions.

In accordance with this Embodiment also, since the erasing voltage is greatly lowered, the margin of the erasing voltage for the voltage resistance of the gate insulating film can be made much greater. Therefore, the reliability of the semiconductor storage unit can be improved.

In still another Embodiment of the semiconductor storage unit in accordance with the first aspect of the present invention, the semiconductor layer is provided with a body region placed between the two diffusion layers, and a voltage higher than the reference voltage is applied to the body region.

In accordance with this Embodiment also, it becomes possible to make the erasing speed faster by the use of a lower erasing voltage.

Moreover, in this Embodiment of the semiconductor storage unit in accordance with the first aspect of the present invention, a reading process is carried out, while one of the diffusion regions is used as a source, with the other diffusion region being used as a drain.

In accordance with this embodiment, a charge accumulated in the gate insulating film can be detected with high response as storage information.

In still another Embodiment of the semiconductor storage unit in accordance with the first aspect of the present invention, charges are independently injected to the gate insulating film on the side closer to one of the diffusion regions and to the gate insulating film on the side closer to the other diffusion region respectively so that information of two bits can be stored.

In accordance with this Embodiment, since the semiconductor storage unit of the present invention can be two-bit operated, the storage capacity can be increased.

Moreover, still another Embodiment of the semiconductor storage unit in accordance with the first aspect of the present invention is characterized in that the semiconductor layer is formed on an insulating substrate.

In accordance with this Embodiment, the semiconductor storage unit of the present invention can be utilized in a wider range.

Referring to FIG. 1, the following description will discuss the semiconductor storage unit in accordance with the first aspect of the present invention in more detail. FIG. 1 is a schematic cross-sectional view that shows a storage unit 1 (non-volatile memory) of first Embodiment in accordance with the first aspect of the present invention, and the semiconductor storage unit 1 has a structure in which a base insulating film 102 is formed on an insulating substrate 101 and a semiconductor layer 117 is formed on the base insulating film 102. Two diffusion layer regions 112 and 113 functioning as a source region and a drain region are formed on the semiconductor layer 117, with a body region 111 interposed therebetween. A gate insulating film 121, which forms the featured portion of the present invention, is laminated on the semiconductor layer 117, and a gate electrode 131 is formed thereon in this order. The interface portion between the body region 111 and the gate insulating film 121 is an area that forms an inverted layer when the transistor is in the on-state, that is, a so-called channel region.

The semiconductor storage unit of first Embodiment of the present invention is designed so that a current flowing between the two diffusion layer regions is changed depending on the quantity of charge accumulated in the gate insulating film 121.

Any substrate may be used as the insulating substrate 101 as long as it has an insulating property, and, for example, a glass substrate, a ceramic substrate, an alumina substrate, or a resin substrate may be used. When a transparent substrate is prepared, the substrate can be used as a display such as a light-transmitting type liquid crystal panel; therefore, a glass substrate and a transparent resin substrate are preferably used. Moreover, a resin substrate is preferably used because the substrate becomes flexible, a light-weight substrate is achieved and the impact-resistant property can be easily improved.

The base insulating film 102 is not necessarily required. However, in the case when a glass substrate is used as the insulating substrate 101, a silicon oxide film, a silicon acid nitride film, a silicon nitride film or a laminated film of these may be preferably used. In this case, it is possible to prevent devices formed on the glass substrate from being contaminated with impurities scattered from the glass substrate.

The semiconductor layer 117 may be made from, for example, amorphous silicon, polysilicon, or monocrystal silicon. In addition to these, semiconductor materials, such as silicon germanium and germanium, may be used. The semiconductor layer 117 made from any of these materials is preferably formed to have a thickness of, for example, 30 nm to 150 nm, so as to exert a memory effect in cooperation with the gate insulating film containing carbon atoms. The thickness of less than 30 nm makes it difficult to maintain the evenness of the film thickness, and the thickness exceeding 150 nm tends to fail to form holes completely upon operation of the transistor, resulting in degradation in characteristics. In order to obtain the memory effect of the present invention, the thickness of the semiconductor layer 117 is preferably from 50 nm to 100 nm, more preferably, from 60 nm to 80 nm.

In the case when an N-channel type semiconductor storage unit 1 is used, the two diffusion layer regions 112 and 113 are N-channel-type conductive regions. In contrast, in the case when a P-channel type semiconductor storage unit 1 is used, the two diffusion layer regions 112 and 113 are P-channel-type conductive regions. In the case of the N-channel type semiconductor storage unit 1, the body region 111 is preferably prepared as a P-type conductive region or as an intrinsic region. In the case of the P-channel type semiconductor storage unit 1, it is preferably prepared as an N-type conductive region or as an intrinsic region.

The gate insulating film 121, formed on the channel region inside the semiconductor layer 117, is made of a silicon oxide film containing carbon atoms of 0.1 atomic percent of more. The silicon oxide film containing carbon atoms of about 0.1 atomic percent or more is allowed to accumulate charge, and exerts a remarkable memory effect. When the gate insulating film 121 contains carbon atoms exceeding about 5.0 atomic percent or more, its functions as a gate insulating film deteriorates extremely; therefore, the rate of carbon atoms contained in the gate insulating film 121 is preferably set in a range from 0.1 atomic percent or more to 5.0 atomic percents or less. Here, the rate of carbon atoms contained in the gate insulating film can be quantitatively analyzed by an SIMS process (secondary ion mass spectrometry) or an XPS process (X-ray photoelectric spectral analysis). The rate of carbon atoms is preferably set to 2.0 to 4.0 atomic percent, more preferably, to 2.5 to 4.0 atomic percent. In particular, a semiconductor storage unit including silicon oxide films containing carbon atoms of 3.0 atomic percent, 3.5 atomic percent and 4.0 atomic percent is allowed to exert a desirable memory effect.

In the present invention, the thickness of the gate insulating film is preferably set in a range from 20 nm to 150 nm so as to allow the gate insulating film containing carbon atoms to exert a memory effect. The thickness of less than 20 nm fails to maintain the evenness of the film thickness, and causes an insufficient voltage resistance. Moreover, the thickness exceeding 150 nm causes a very high threshold value, and also makes the on-current extremely small. The gate insulating film may be prepared either as a thermal oxide film or as a deposition film; however, in the present invention, a deposition film is preferably used. Although also changed depending on the atomic weight, the film thickness of the gate insulating film is preferably set to 50 to 120 nm, more preferably, to 80 to 100 nm.

A gate electrode 131 is formed on the gate insulating film 121. Although not particularly limited, examples of the material for the gate electrode 131 include metals such as W, Ta, Al, TaN and TaAlN, and semiconductors, such as amorphous silicon and polysilicon.

The semiconductor storage unit in accordance with first Embodiment of the present invention may be formed by virtually the same processes as those used for manufacturing a normal thin-film transistor (TFT). With respect to the method for forming the gate insulating film containing carbon atoms, for example, a CVD (chemical vapor deposition) method in which tetraethoxysilane (TEOS) is introduced with the substrate temperature being set to 500° C., may be used. In this case, in order to increase the concentration of carbon atoms, for example, the concentration of oxygen to be introduced upon carrying out the CVD method may be lowered, or the substrate temperature during the CVD method may be lowered. In order to reduce the concentration of carbon atoms, the reversed process may be carried out.

Figure 2:
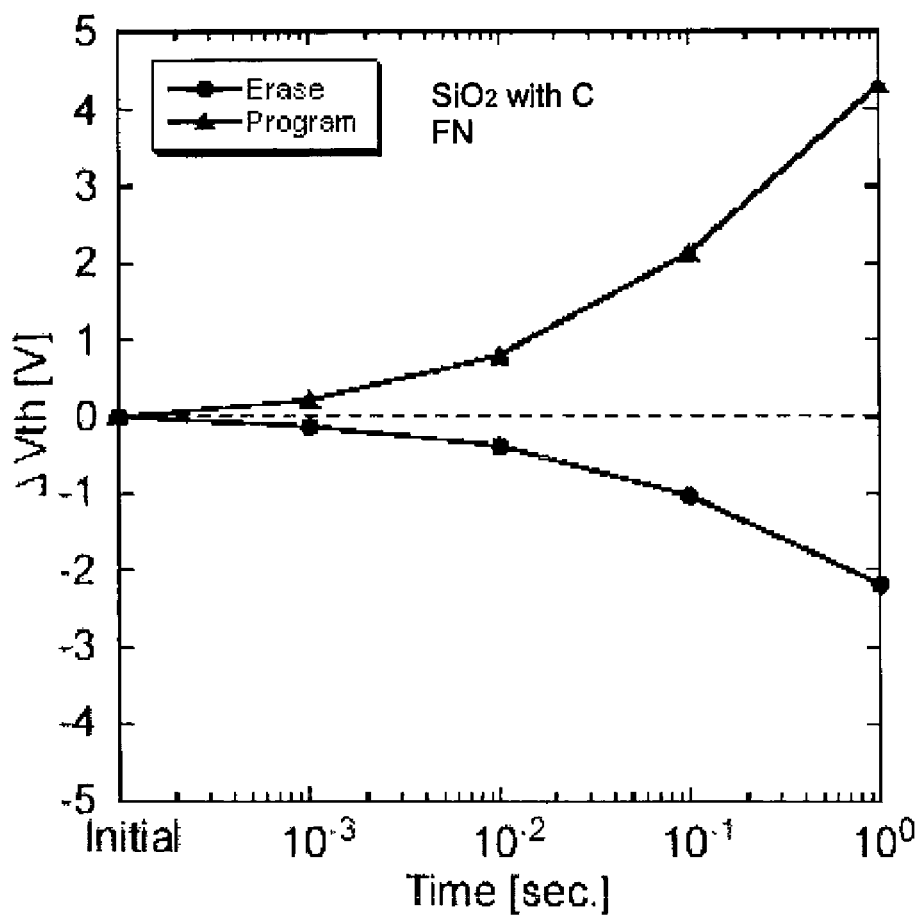
FIG. 2 is a graph that shows fluctuations in threshold value upon carrying out a writing process of a first writing method and an erasing process of a first erasing method on a semiconductor storage unit in accordance with first Embodiment of the present invention.

The following description will discuss the first writing method and the first erasing method of the semiconductor storage unit in accordance with first Embodiment of the present invention. FIG. 2 is a graph that shows threshold-value fluctuation characteristics of the first writing method and the first erasing method. The axis of abscissas represents the time (see) and the axis of ordinates represents the threshold value (V). Here, the first writing method and the first erasing method respectively relate to electron injection and hole injection caused by FN tunnel. The semiconductor storage unit that has obtained the characteristic of FIG. 2 is of the N-channel type. That of the P-channel type can obtain virtually the same results as well. The gate insulating film is made from a silicon oxide film containing carbon atoms of 0.1 atomic percent, and has a thickness of 70 nm. Even when the gate insulating film contains carbon atoms of 0.1 atomic percent or more, the writing speed and the erasing speed do not become extremely fast. In other words, the threshold value fluctuation characteristic of FIG. 2 is also obtained in the case when the gate insulating film contains carbon atoms of 0.1 atomic percent or more. In contrast, in the case when the gate insulating film contains carbon atoms exceeding 5.0 atomic percent or more, this state is not desirable because the functions as the gate insulating film, such as a voltage resistant characteristic, deteriorate.

Voltage conditions at the time of writing are +60V in the voltage (Vg) of the gate electrode and 0V in each of the voltage (Vs) of the source electrode, the voltage (Vd) of the drain electrode and the voltage (Vsub) in the body region. Voltage conditions at the time erasing are −70V in the voltage (Vg) of the gate electrode and 0V in each of the voltage (Vs) of the source electrode, the voltage (Vd) of the drain electrode and the voltage (Vsub) in the body region. Here, the above-mentioned voltages are only examples, and the present embodiment is not intended to be limited thereby.

In FIG. 2, the curve above a dotted line in the center indicates changes in the threshold value upon carrying out a writing operation in accordance with the first writing method. The curve below the dotted line in the center indicates changes in the threshold value upon carrying out an erasing operation in accordance with the first erasing method. As clearly indicated by FIG. 2, the semiconductor storage unit of first Embodiment, prepared with a silicon oxide film containing carbon atoms of 0.1 atomic percent or more, is clearly allowed to exert a memory effect.

Figure 3:
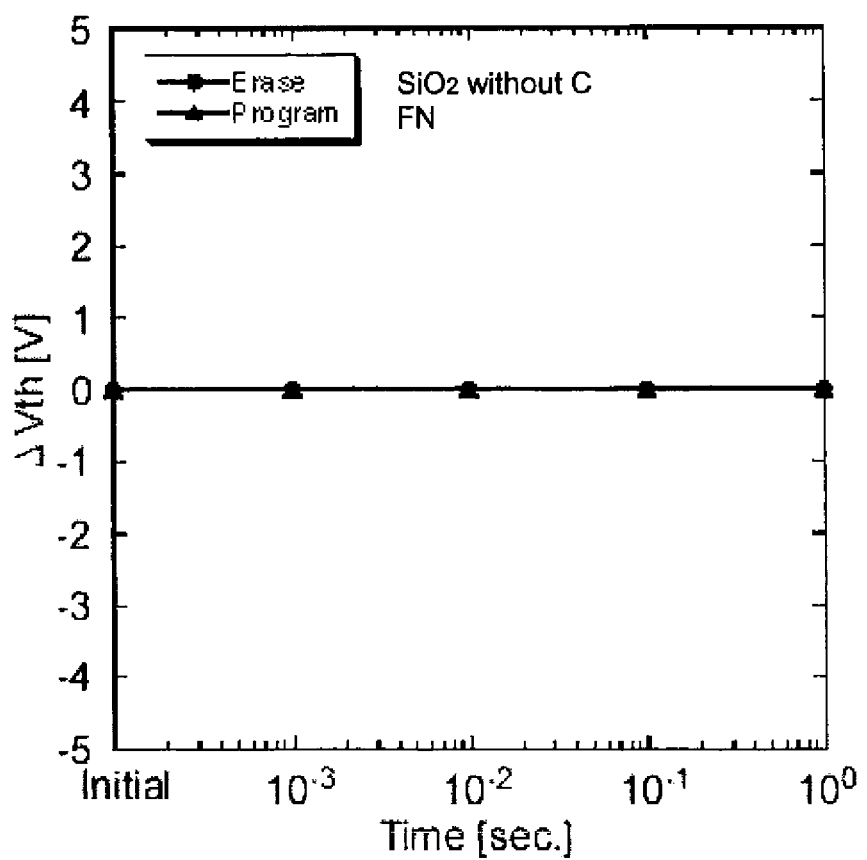
FIG. 3 is a graph that shows fluctuations in threshold value upon carrying out the writing process of the first writing method and the erasing process of the first erasing method on an element serving as a reference to the semiconductor storage unit in accordance with first Embodiment of the present invention.

In contrast, FIG. 3 is a graph that shows threshold-value fluctuation characteristics obtained upon carrying out a writing process and an erasing process by applying an electric field having the same intensity to an element provided with a silicon oxide film containing no carbon atoms (below detection limit in SIMS), which forms a reference to the semiconductor storage unit of first Embodiment of the present invention. The axis of abscissas represents the time (see) and the axis of ordinates represents the threshold value (V). The same structure as that of the semiconductor storage unit of first Embodiment is used except that the silicon oxide film forming the gate insulating film contains no carbon atoms. As clearly shown by FIG. 3, no memory effect is exerted.

As clearly indicated by the above-mentioned results, the key of the present invention is to use a silicon oxide film containing carbon atoms of 0.1 atomic percent or more as the gate insulating film, and this structure can be utilized as a non-volatile memory without the necessity of using an ONO film or the like in which a silicon nitride film is used. The rate of the carbon atoms may be increased to exceed 0.1 atomic percent. However, in the case when the silicon oxide film contains carbon atoms exceeding 5.0 atomic percent, the functions as the gate insulating film extremely deteriorate so that the rate of carbon atoms contained in the silicon oxide film is preferably set in a range from 0.1 atomic percent or more to 5.0 atomic percents or less.

In the semiconductor storage unit of the present embodiment, the gate insulating film functioning as a memory storage unit is made of a single layer silicon oxide film containing carbon atoms of 0.1 atomic percent or more. Therefore, in comparison with a conventional art semiconductor storage unit in which a gate insulating film having an ONO structure using a silicon nitride film is used as a memory storage unit, the element structure can be simplified and the number of processes required for the formation thereof can be reduced.

The following description will discuss the second writing method and the second erasing method of the semiconductor storage unit in accordance with first Embodiment of the present invention. The second writing and erasing methods make it possible to greatly reduce a voltage in comparison with that of the first writing and erasing methods. To reduce the voltage of the writing and erasing methods is very important for the present invention. The reason for this is explained as follows:

The semiconductor storage unit of the present invention is characterized in that the gate insulating film is made of a silicon oxide film containing carbon atoms of 0.1 atomic percent or more. This gate insulating film can be formed by using a CVD method; however, such a gate insulating film has the disadvantage that the voltage resistance is slightly lower than that of a thermal oxide film used in a general LSI process.

Consequently, in the first writing and erasing methods in which the FN tunnel phenomenon is utilized, the voltage at the time of writing and erasing processes becomes close to the voltage resistance of the silicon oxide film.

Figure 4:
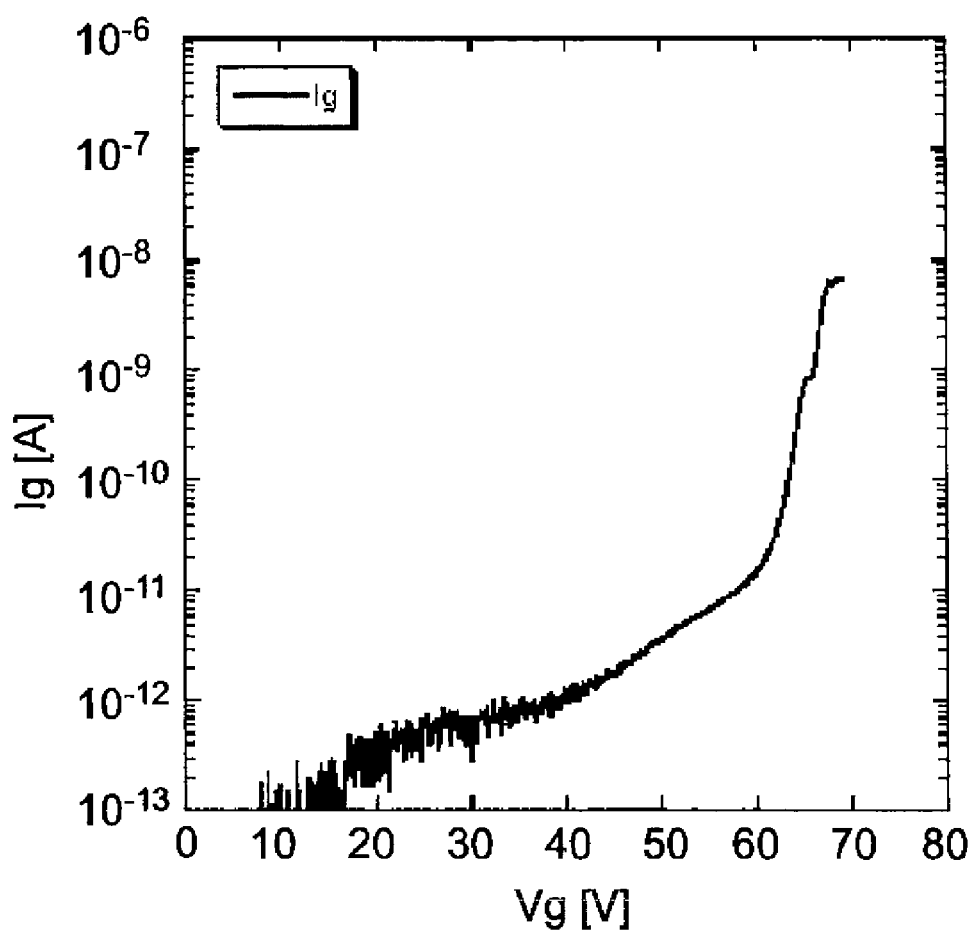
FIG. 4 is a graph that shows a gate voltage resistant characteristic upon application of a positive voltage to a gate electrode of the semiconductor storage unit in accordance with first Embodiment of the present invention.
Figure 5:
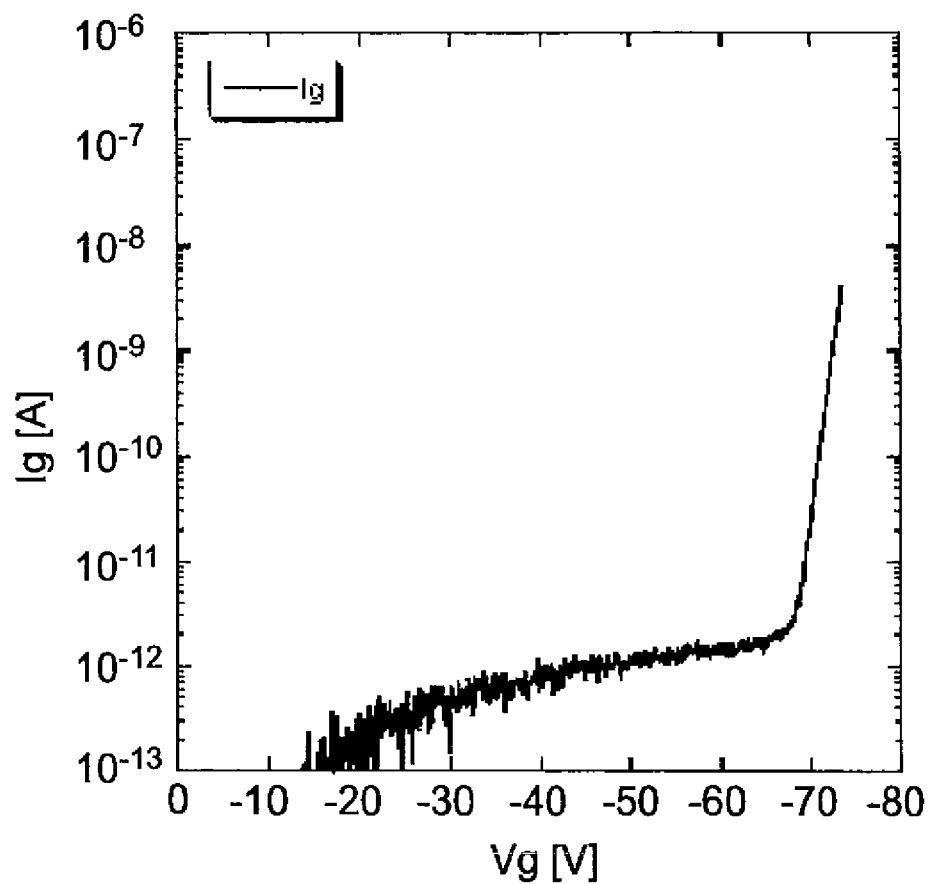
FIG. 5 is a graph that shows a gate voltage resistant characteristic upon application of a negative voltage to a gate electrode of the semiconductor storage unit in accordance with first Embodiment of the present invention.

FIGS. 4 and 5 are graphs that show a gate current at the time of application of a voltage to the gate electrode of the semiconductor storage unit (N-channel type) of first Embodiment used for the measurements of FIG. 2. The axis of abscissas represents the gate voltage Vg (V) and the axis of ordinates represents the gate current Ig (A). Upon application of a positive gate voltage (FIG. 4), the gate insulating film gets ruptured at 69V to cause a large current to flow (no data of 69V or more is shown in the graph). This voltage is close to the applied voltage (60V) in the first writing method.

In contrast, upon application of a negative gate voltage (FIG. 5), the gate insulating film gets ruptured at −73V to cause a large current to flow (no data of −73V or more is shown in the graph). This voltage is close to the applied voltage (−70V) in the first erasing method. However, in the case of such a transistor as to be manufactured by a normal LSI process in which a silicon oxide film containing no carbon atoms is used as the gate insulating film, since the voltage resistance of the gate insulating film becomes greater, the margin of voltage resistance for the gate insulating film at the time of writing and erasing can be made larger. As clearly described above, to reduce the voltage of the writing and erasing methods forms an inherent subject of the present invention.

Figure 6:
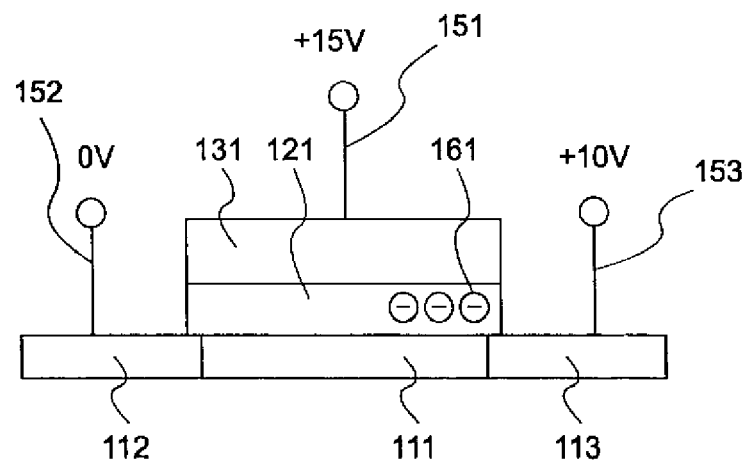
FIG. 6 is a drawing that explains a second writing method of a semiconductor storage unit (N-channel type) in accordance with first Embodiment of the present invention.

Referring to FIGS. 6 (N-channel type) and 7 (P-channel type), the following description will discuss the second writing method of the semiconductor storage unit of first Embodiment of the present invention.

As shown in FIG. 6, in the case of the N-channel type, while a reference voltage (0V) is applied to a terminal 152 connected to one of the diffusion layer regions 112 with a voltage higher than the reference voltage (for example, +10V) being applied to a terminal 153 connected to the other diffusion layer region 113, a voltage (for example, +15V) higher than the reference voltage is applied to a terminal 151 connected to the gate electrode 131. Thus, high energy electrons are generated within a body region 111 near the other diffusion layer region 113 so that electrons 161 are injected into the gate insulating film 121 near the other diffusion layer region 113; thus, a writing process is carried out. When a reading process is thus carried out, with the writing process being conducted, a reading current flowing between one of the diffusion layer region 112 and the other diffusion layer region 113 is reduced. Here, the above-mentioned voltages are only examples, and the present embodiment is not intended to be limited thereby.

Figure 7:
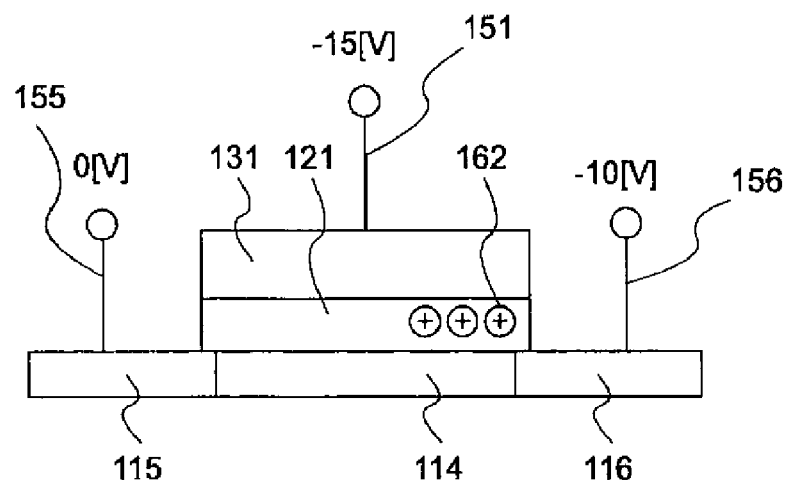
FIG. 7 is a drawing that explains a second writing method of a semiconductor storage unit (P-channel type) in accordance with first Embodiment of the present invention.

In contrast, as shown in FIG. 7 in the case of the P-channel type, while a reference voltage (0V) is applied to a terminal 155 connected to one of the diffusion layer regions 115 with a voltage lower than the reference voltage (for example, −10V) being applied to a terminal 156 connected to the other diffusion layer region 116, a voltage (for example, −15V) lower than the reference voltage is applied to the terminal 151 connected to the gate electrode 131. Thus, high energy holes are generated within a body region 114 near the other diffusion layer region 113 so that holes 162 are injected into the gate insulating film 121 near the other diffusion layer region 113; thus, a writing process is carried out. When a reading process is carried out with the writing process being thus conducted, a reading current flowing between one of the diffusion layer region 112 and the other diffusion layer region 113 is reduced. Here, the above-mentioned voltages are only examples, and the present embodiment is not intended to be limited thereby.

Figure 8:
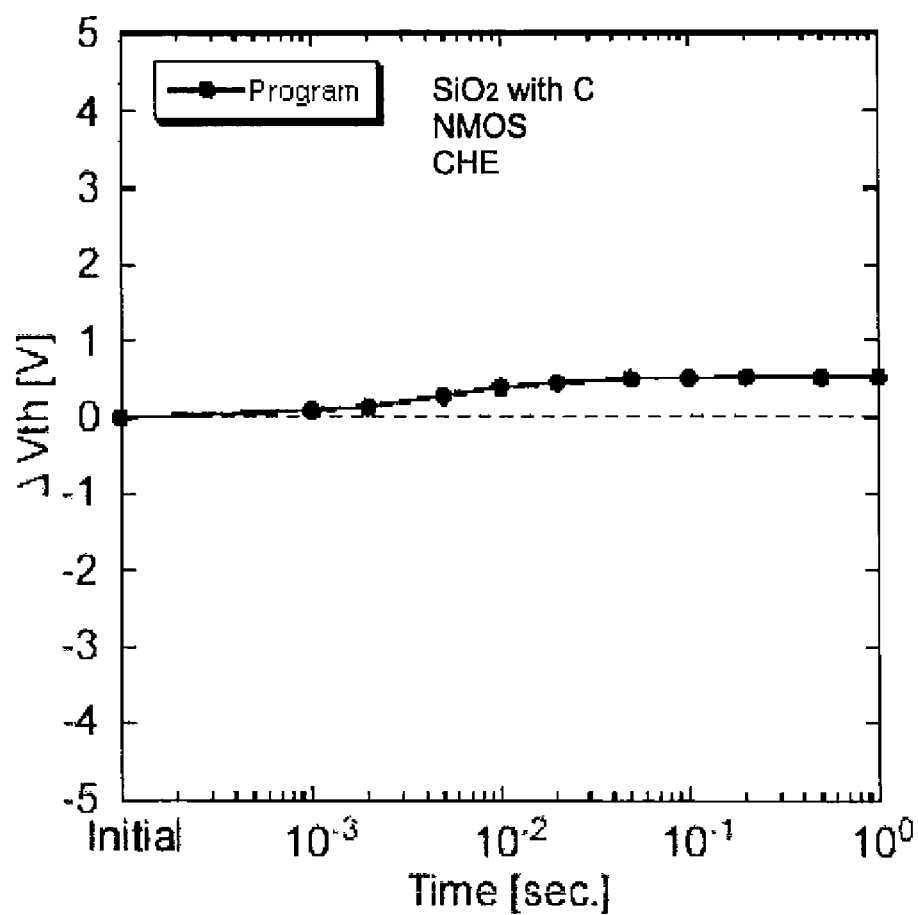
FIG. 8 is a graph that shows fluctuations in threshold value upon carrying out a writing process of a second writing method on a semiconductor storage unit (N-channel type) in accordance with first Embodiment of the present invention.
Figure 9:
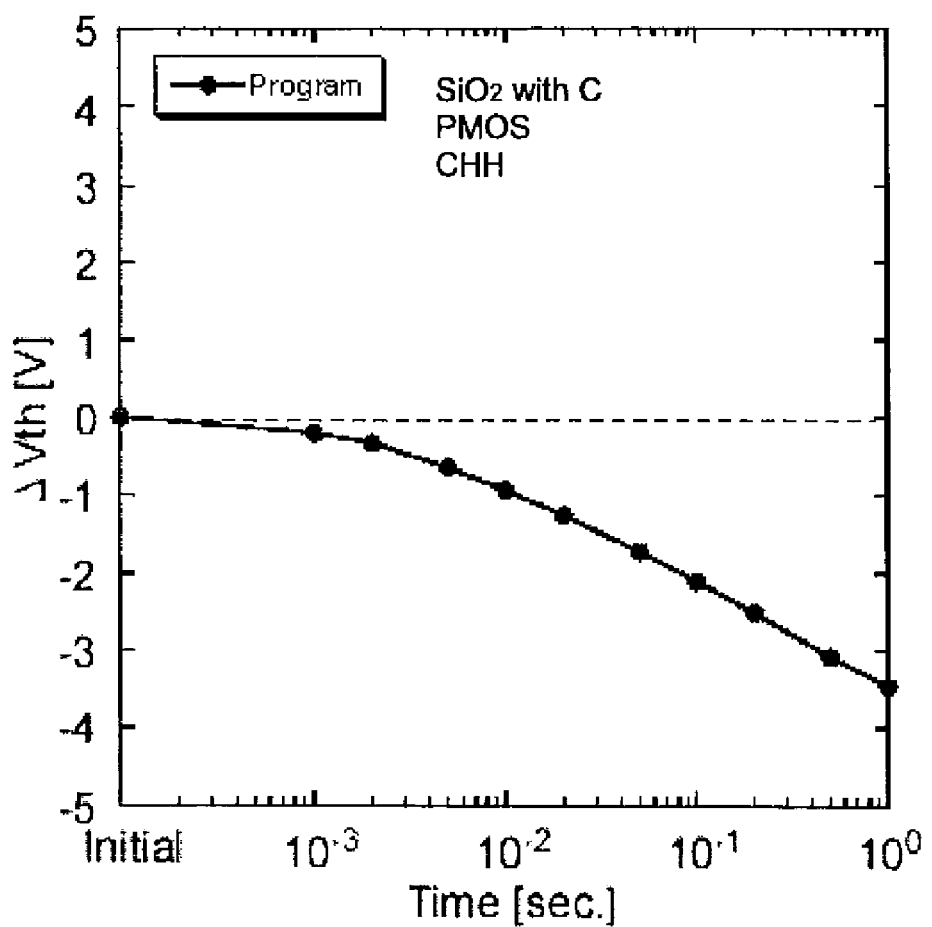
FIG. 9 is a graph that shows fluctuations in threshold value upon carrying out the writing process of the second writing method on a semiconductor storage unit (P-channel type) in accordance with first Embodiment of the present invention.

FIGS. 8 and 9 are graphs that show threshold-value fluctuation characteristics upon carrying out the second writing method respectively on semiconductor storage units of the N-channel type and the P-channel type. The characteristics (in the case of the N-channel type), shown in FIG. 8, are obtained upon application of +20V to the terminal 151 connected to the gate electrode, with +11V being applied to the terminal 153 connected to the other diffusion layer region 113, in the case of carbon atoms of 0.1 atomic percent. The characteristics (in the case of the P-channel type), shown in FIG. 9, are obtained upon application of −20V to the terminal 151 connected to the gate electrode, with −11V being applied to the terminal 156 connected to the other diffusion layer region 116, in the case of carbon atoms of 0.1 atomic percent. That is, the absolute values of the voltages applied to the two terminals are the same.

As clearly indicated by the results shown in FIGS. 8 and 9, the second writing method (+20V or −0V applied to the gate electrode) makes it possible to definitely achieve a low voltage in comparison with the first writing method (+60V applied to the gate electrode). Of course, in the case when +20V is applied to the gate electrode in the first writing method, no writing process is available. For this reason, by applying the second writing method to the semiconductor storage unit of the present embodiment, the margin of the writing voltage for the voltage resistance of the gate insulating film is always made much greater. Therefore, the reliability of the semiconductor storage unit can be improved.

Moreover, when the results shown in FIGS. 8 and 9 are compared, a faster writing process is achieved in the case shown in FIG. 9. That is, the semiconductor storage unit of the present invention is preferably prepared as the P-channel type. In other words, the diffusion layer region has a conductive type of P-type so that by accumulating holes to the gate insulating film, a writing process is preferably carried out so as to reduce a current flowing between the two diffusion layer regions. In a non-volatile memory formed in the normal LSI process, the element of the N-channel type is used in most cases, and the fact that the P-channel type is desirably used forms the inherent feature of the present invention.

Figure 10:
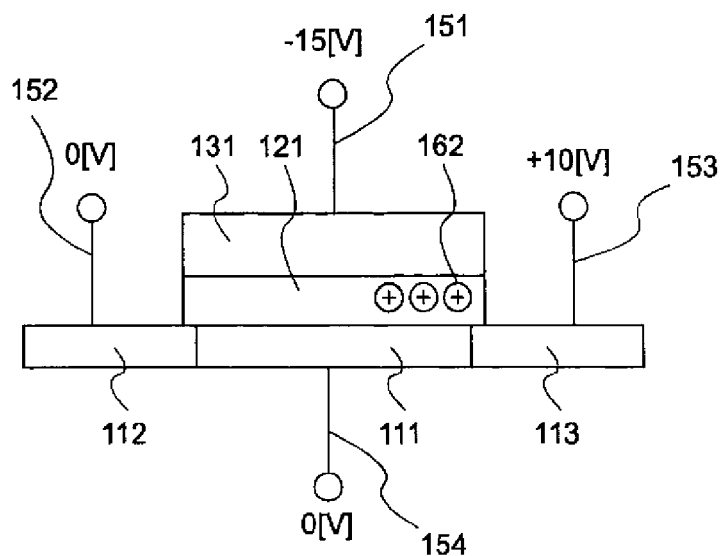
FIG. 10 is a drawing that explains a second erasing method of a semiconductor storage unit (N-channel type) in accordance with first Embodiment of the present invention.

Next, referring to FIGS. 10 (N-channel type) and 11 (P-channel type), the following description will discuss the second erasing method of the semiconductor storage unit of first Embodiment of the present invention.

As shown in FIG. 10, in the case of the N-channel type, while a reference voltage (0V) is applied to the terminal 152 connected to one of the diffusion layer regions 112, with a voltage higher than the reference voltage (for example, +10V) being applied to a terminal 153 connected to the other diffusion layer region 113, a voltage (for example, −15V) lower than the reference voltage is applied to a terminal 151 connected to the gate electrode 131, with the reference voltage (for example, 0V) being applied to a terminal 154 connected to the body region 111. Thus, high energy holes are generated within a body region 111 near the other diffusion layer region 113 so that holes 162 are injected into the gate insulating film 121 near the other diffusion layer region 113; thus, the holes are joined with the electrons 161 accumulated in the gate insulating film 121 through the writing process to be neutralized to form an erased state. Therefore, a reading current is increased. Here, the above-mentioned voltages are only examples, and the present embodiment is not intended to be limited thereby.

Figure 11:
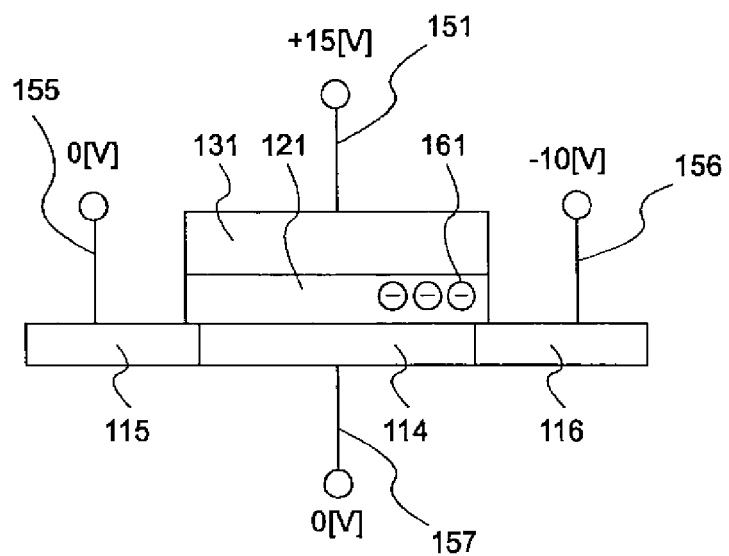
FIG. 11 is a drawing that explains a second erasing method of a semiconductor storage unit (P-channel type) in accordance with first Embodiment of the present invention.

In contrast, as shown in FIG. 11, in the case of the P-channel type, while a reference voltage (0V) is applied to a terminal 155 connected to one of the diffusion layer regions 115, with a voltage lower than the reference voltage (for example, −10V) being applied to a terminal 156 connected to the other diffusion layer region 116, a voltage (for example, +15V) higher than the reference voltage is applied to the terminal 151 connected to the gate electrode 131, with the reference voltage (for example, 0V) being applied to a terminal 157 connected to the body region 114. Thus, high energy electrons are generated within the body region 114 near the other diffusion layer region 116 so that electrons 161 are injected into the gate insulating film 121 near the other diffusion layer region 116; thus, a reading current is increased. Here, the above-mentioned voltages are only examples, and the present embodiment is not intended to be limited thereby.

Figure 12:
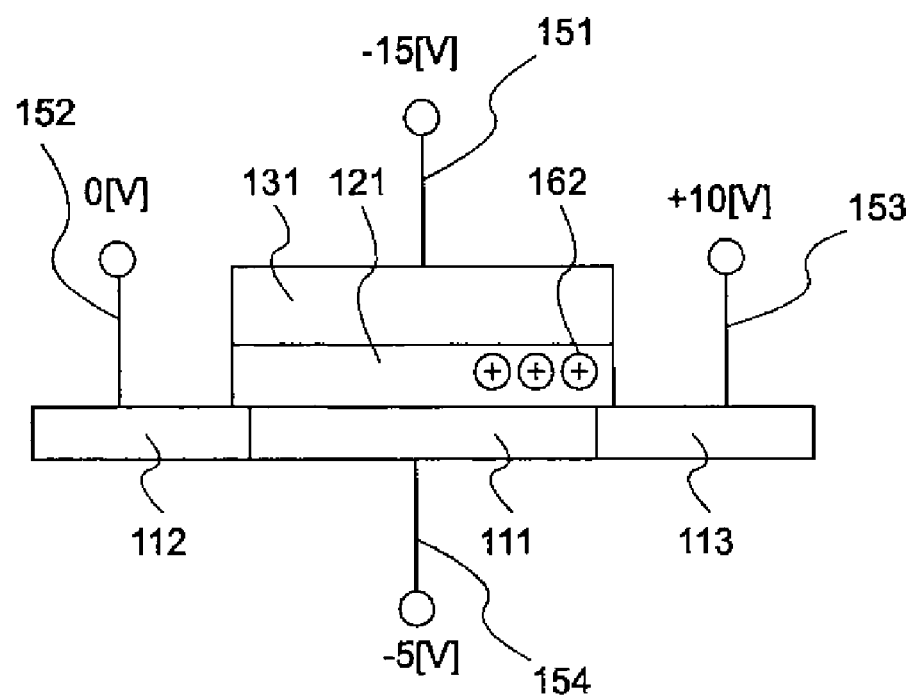
FIG. 12 is a drawing that explains a third erasing method of a semiconductor storage unit (N-channel type) in accordance with first Embodiment of the present invention.

Moreover, referring to FIGS. 12 (N-channel type) and 13 (P-channel type), the following description will discuss the third erasing method of the semiconductor storage unit of first Embodiment of the present invention.

As shown in FIG. 12, in the case of the N-channel type, while a reference voltage (0V) is applied to the terminal 152 connected to one of the diffusion layer regions 112 with a voltage higher than the reference voltage (for example, +10V) being applied to a terminal 153 connected to the other diffusion layer region 113, a voltage (for example, −15V) lower than the reference voltage is applied to a terminal 151 connected to the gate electrode 131, with a voltage (for example, −5V) lower than the reference voltage being applied to a terminal 154 connected to the body region 111. That is, the third erasing method is different from the second erasing method in that a voltage lower than the reference voltage is applied to the terminal 154 connected to the body region 111. With this structure also, high energy holes are generated within the body region 111 near the other diffusion layer region 113 so that holes 162 are injected into the gate insulating film 121 near the other diffusion layer region 113; thus, the reading current is increased. Here, the above-mentioned voltages are only examples, and the present embodiment is not intended to be limited thereby.

Figure 13:
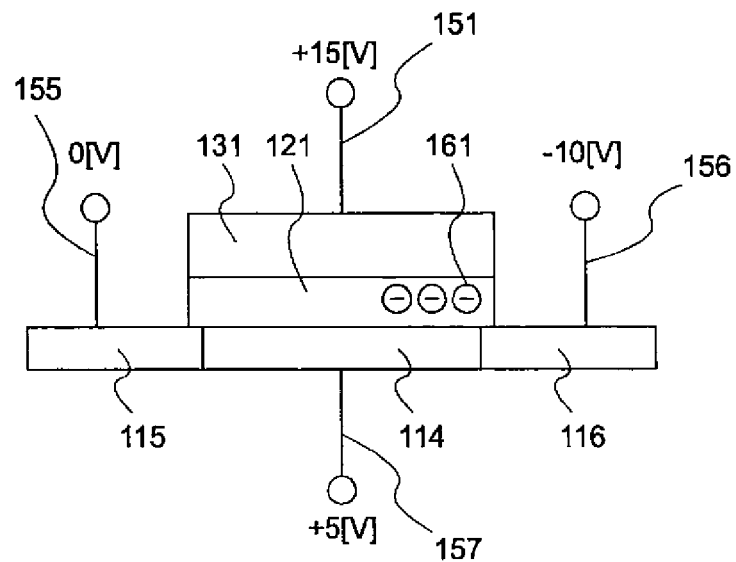
FIG. 13 is a drawing that explains a third erasing method of a semiconductor storage unit (P-channel type) in accordance with first Embodiment of the present invention.

In contrast, as shown in FIG. 13, in the case of the P-channel type, while a reference voltage (0V) is applied to a terminal 155 connected to one of the diffusion layer regions 115 with a voltage lower than the reference voltage (for example, −10V) being applied to a terminal 156 connected to the other diffusion layer region 116, a voltage (for example, +15V) higher than the reference voltage is applied to the terminal 151 connected to the gate electrode 131, with a voltage (for example, +5V) higher than the reference voltage being applied to a terminal 157 connected to the body region 114. That is, the third erasing method is different from the second erasing method in that a voltage higher than the reference voltage is applied to the terminal 157 connected to the body region 114. With this structure also, high energy electrons are generated within the body region 114 near the other diffusion layer region 116 so that electrons 161 are injected into the gate insulating film 121 near the other diffusion layer region 116; thus, the reading current is increased. Here, the above-mentioned voltages are only examples, and the present embodiment is not intended to be limited thereby.

Figure 14:
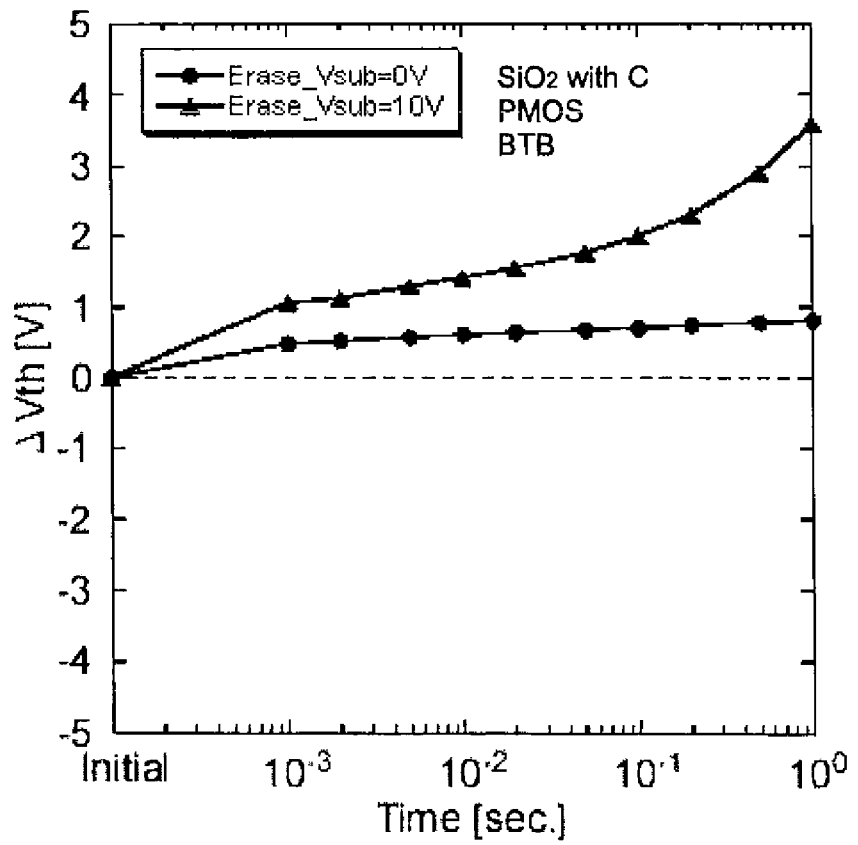
FIG. 14 is a graph that shows fluctuations in threshold value upon carrying out the erasing processes of the second and third erasing methods on the semiconductor storage unit in accordance with first Embodiment of the present invention.

FIG. 14 is a graph that shows threshold-value fluctuation characteristics upon carrying out the second and third erasing methods on a semiconductor storage unit of the P-channel type. The characteristics, shown in FIG. 14, are obtained upon application of +20V to the terminal 151 connected to the gate electrode, with −11V being applied to the terminal 156 connected to the other diffusion layer region 116, in the case of 0.1 atomic percent of carbon atoms, with respect to each of the second and third erasing methods. Moreover, in the third erasing method, +10V is also applied to the terminal 157 connected to the body region 114.

As clearly indicated by the results shown in FIG. 14, both of the second and third erasing methods (the greatest absolute value of the voltage to be applied is 20V of the gate electrode) make it possible to definitely achieve a low voltage in comparison with that of the first erasing method (the greatest absolute value of the voltage to be applied is 70V of the gate electrode). Of course, in the case when −20V (20V in the absolute value) is applied to the gate electrode in the first writing method, no erasing process is available. For this reason, by applying the second or third erasing method to the semiconductor storage unit of first Embodiment, the margin of the erasing voltage for the voltage resistance of the gate insulating film can be made much greater. Therefore, the reliability of the semiconductor storage unit can be improved.

The above-mentioned results are related to the P-channel type, and in the case of the N-channel type, a voltage higher than that of the P-channel type by about several Volts needs to be used. Therefore, the semiconductor storage unit of the present invention is preferably prepared as the P-channel type. However, even in the case of the N-channel type, by using the second or third erasing method, the erasing process can be carried out by using a voltage that is much lower than that of the first erasing method.

When the second erasing method and the third erasing method are compared with each other, the third erasing method carries out the erasing process at a higher speed as clearly shown by FIG. 14. At this time, the voltage applied to the body region is positive relative to the reference voltage, and this symbol is the same as the symbol of the voltage applied to the gate electrode. Therefore, by using the third erasing method, it becomes possible to carry out a high-speed erasing process, without the necessity of taking the voltage resistance of the gate insulating film into consideration.

Here, in the second and third erasing methods, a charge is injected only into the gate insulating film near the other diffusion layer region. However, charges can be simultaneously injected into the gate insulating film near one of the diffusion regions as well as near the other diffusion region. In the case of the N-channel type, for example, a reference voltage (0V) may be applied to the terminal 154 connected to the body region 111, with a higher voltage (for example, +10v) being applied to the terminals 152 and 153 respectively connected to one of the diffusion layer regions 112 and the other diffusion layer region 113, while a voltage (for example, −15V) lower than the reference voltage is being applied to the terminal 151 connected to the gate electrode 131. In the case of the P-channel type, all the symbols of the above-mentioned voltage conditions can be reversed.

Figure 15:
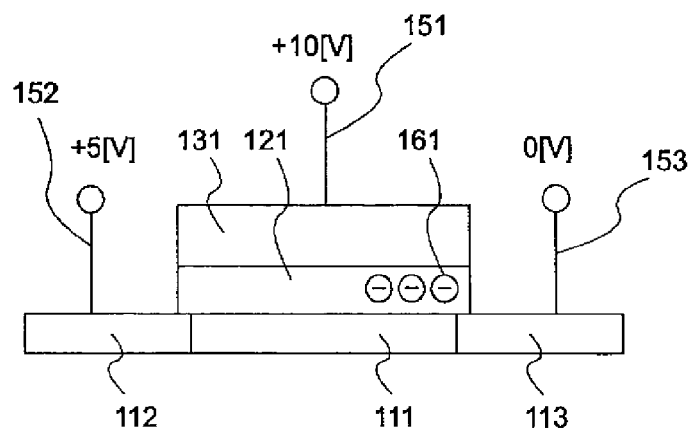
FIG. 15 is a drawing that explains a reading method of a semiconductor storage unit in accordance with first Embodiment of the present invention.

Next, the following description will discuss a desirable reading method upon carrying out each of the second writing method, the second erasing method and the third erasing method. For example, the following description will discuss the N-channel type structure in which electrons are injected (written) into the gate insulating film 121 near the other diffusion layer region 113. In this case, as shown in FIG. 15, a reference voltage (0V) is applied to the terminal 153 connected to the other diffusion layer region 113, with a voltage (for example, +5V) higher than the reference voltage being applied to the terminal 152 connected to one of the diffusion layer regions 112, while a voltage (for example, +10V) higher than the reference voltage is being applied to the terminal 151 connected to the gate electrode 131. The above-mentioned voltages are only examples, and although not limited by these, it is necessary to suppress a voltage to such a level as not to exert writing. The same is true for the state in which holes are injected into the gate insulating film. Here, in the case of the P-channel type, all the symbols of the above-mentioned voltage conditions can be reversed. Moreover, in the case when electrons are injected into the gate insulating film 121 near one of the diffusion regions 112, the voltages of the terminal 152 and the terminal 153 can be exchanged.

That is, the above-mentioned reading method corresponds to a method in which, when electrons or holes are injected into the gate insulating film near the other diffusion layer region 113, one of the diffusion layer regions 112 is used as the drain, with the other diffusion layer region 113 being used as the source. By carrying out such a reading method, a charge, accumulated within the gate insulating film as stored information, can be detected with high response.

Figure 16:
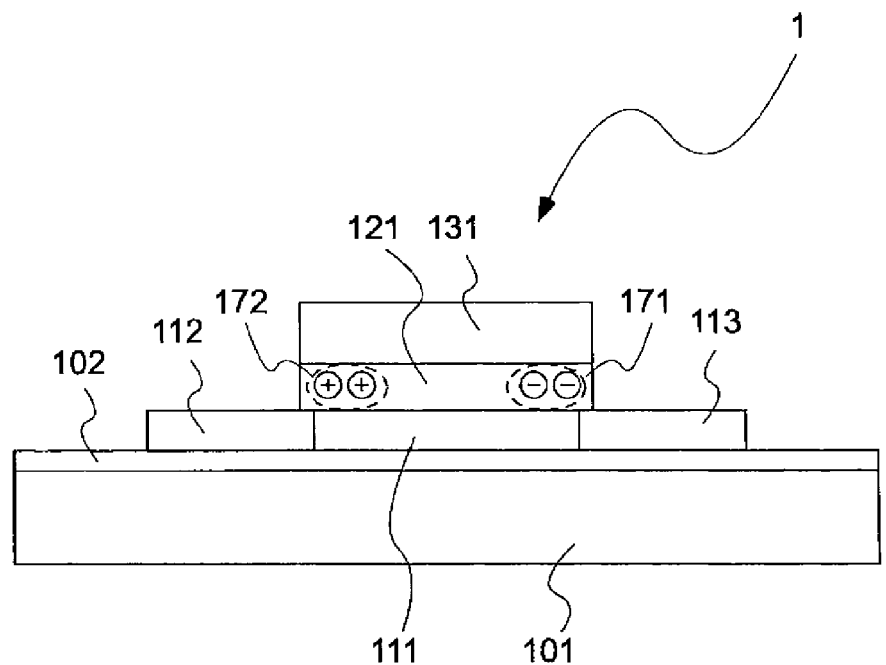
FIG. 16 is a drawing that explains a multivalue operation of the semiconductor storage unit in accordance with first Embodiment of the present invention.

Referring to FIG. 16, the following description will discuss a method for storing information of two bits by using the above-mentioned second writing method, second erasing method or third erasing method and reading method. In accordance with the second writing method, electrons 171 (in the case of N-channel type) or holes 172 (in the case of P-channel type) can be selectively injected into the gate insulating film 121 near one of the diffusion layer regions 112 or near the other diffusion layer region 113. FIG. 16 simultaneously shows states in which in the case of the N-channel type, electrons 171 are injected to the right side of the gate insulating film 121 and in which in the case of the P-channel type, hole 172 are injected to the left side thereof. Moreover, in accordance with the second or third erasing method, holes (in the case of the N-channel type) or electrons (in the case of the P-channel type) are selectively injected into the gate insulating film 121 near one of the diffusion layer regions 112 or near the other diffusion layer region 113. For this reason, as shown in FIG. 16, charges can be independently accumulated into the gate insulating film near one of the diffusion layer regions 112 or near the other diffusion layer region 113 respectively. Moreover, in accordance with the above-mentioned reading method, stored information on the desired one of the sides can be read selectively. The above-mentioned methods make it possible to store and read information of two bits. Since the semiconductor storage unit of the present invention can be two-bit operated, the storage capacity can be increased.

Second Embodiment

A semiconductor device in accordance with the second aspect of the present invention is provided with a semiconductor layer formed on an insulating substrate; a non-volatile memory that has two diffusion layer regions forming a source region and a drain region, which are formed in the semiconductor layer, a channel region fixed between the two diffusion layer regions, a gate insulating film that is formed on the channel region, and made of a silicon oxide film containing carbon atoms of 0.1 to 5.0 atomic percent, and a gate electrode formed on the gate insulating film; and a field effect transistor that has two diffusion layer regions forming a source region and a drain region, which are formed in the semiconductor layer, a channel region fixed between the two diffusion layer regions, a region having a high concentration of impurities and a region having a low concentration of impurities that are respectively formed on each of the two diffusion layer regions, the region having a low concentration of impurities being made in contact with the region having a high concentration of impurities and the channel region, a gate insulating film formed on the channel region, and a gate electrode formed on the gate insulating film.

In accordance with the above-mentioned structure, the semiconductor storage unit relating to the first aspect of the present invention and the field effect transistor having a structure similar to that of the semiconductor storage unit are formed on the same insulating substrate. Moreover, each of the diffusion layer regions of the field effect transistor is constituted by a region having a high concentration of impurities and a region having a low concentration of impurities that is made in contact with the region having a high concentration of impurities and a channel region. Consequently, it becomes possible to effectively prevent the characteristics of the field effect transistor from fluctuating with time. Therefore, with the number of processes to be added being minimized, the switching element and the non-volatile memory element with high reliability can be easily installed in a mixed manner.

Figure 17:
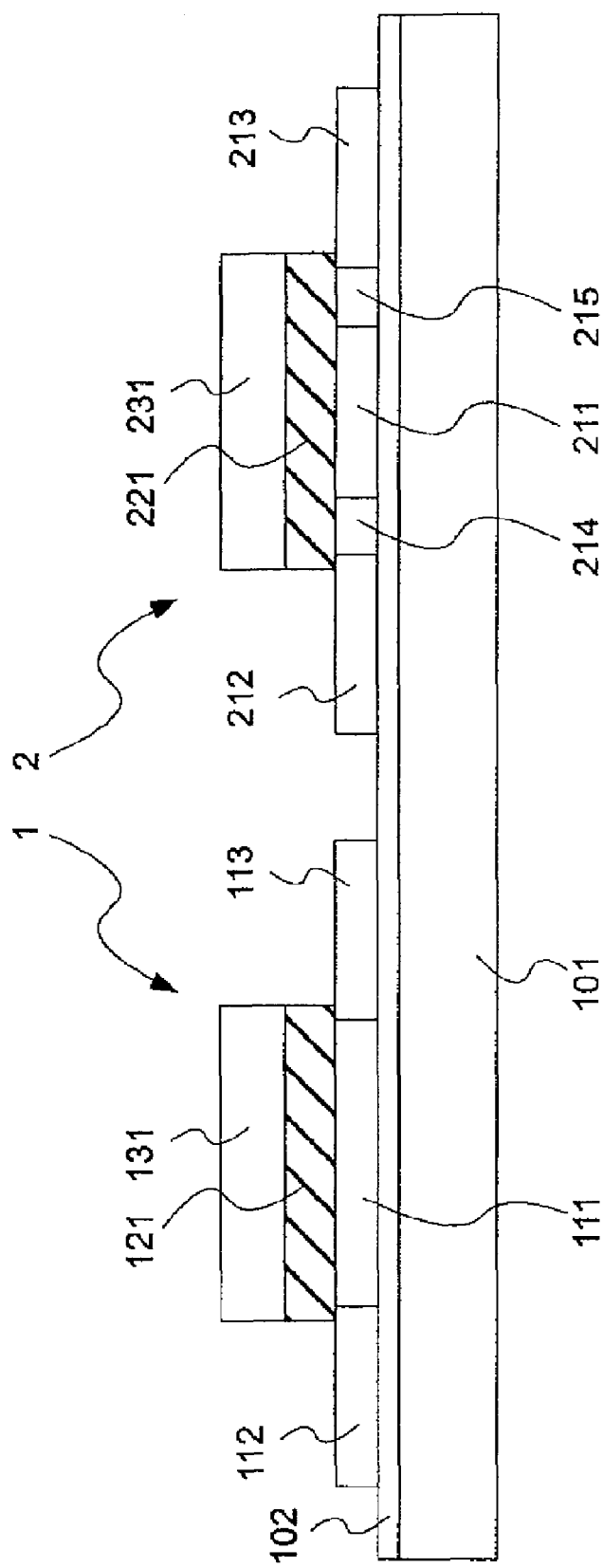
FIG. 17 is a schematic cross-sectional view that shows a semiconductor storage unit in accordance with second Embodiment of the present invention.

As shown in a schematic cross-sectional view of its one mode in FIG. 17, a semiconductor device in accordance with second Embodiment has a structure in which a semiconductor storage unit (non-volatile memory) 1 and a semiconductor device (TFT element) 2 are mounted on the same insulating substrate 101 in a mixed manner. Since the semiconductor storage unit 1 has been explained in detail in the aforementioned first embodiment, the explanation thereof will be omitted. The semiconductor device 2, which is a switching element, is provided with a semiconductor layer formed on an insulating substrate, two diffusion layer regions forming a source region and a drain region, which are formed in the semiconductor layer, a channel region fixed between the two diffusion layer regions, a gate insulating film formed on a channel area and a gate electrode formed on the gate insulating film, and each of the two diffusion layer regions has a region having a high concentration of impurities and a region having a low concentration of impurities that is made in contact with the region having a high concentration of impurities and the channel region.

More specifically, the semiconductor layer of the semiconductor device 2 is composed of a body region 211, regions 214 and 215 having a low concentration of impurities, and regions 212 and 213 having a high concentration of impurities. The channel region is formed in a region inside the body region 211, which is made in contact with the gate insulating film 221. The two diffusion layer regions are respectively formed by the regions 214 and 215 having a low concentration of impurities and the regions 212 and 213 having a high concentration of impurities, and the regions 214 and 215 having a low concentration of impurities are placed between the regions 212, 213 having a high concentration of impurities and the channel region. A gate electrode 231 is placed on the gate insulating film 221. The semiconductor device 2 differs from the semiconductor storage unit 1 in that the diffusion layer regions of the semiconductor device 2 are constituted by the regions 214 and 215 having a low concentration of impurities and the regions 212 and 213 having a high concentration of impurities. It also differs therefrom in that the gate insulating film 221 contains virtually no carbon atoms.

The concentration of impurities of the regions 212 and 213 that have a high concentration of impurities may be respectively set, for example, in a range from $2 \times 10^{19}$ cm$^{-3}$ to $1 \times 10^{21}$ cm$^{-3}$ by using, for example, phosphorous atoms or arsenic atoms in the case of the N-channel type, as well as by using, for example, boron atoms in the case of the P-channel type. The concentration of impurities of the regions 214 and 215 that have a low concentration of impurities may be respectively set, for example, in a range from $1 \times 10^{17}$ cm$^{-3}$ to $1 \times 10^{19}$ cm$^{-3}$ by using, for example, phosphorous atoms or arsenic atoms in the case of the N-channel type, as well as by using, for example, boron atoms in the case of the P-channel type.

The gate insulating film 221 may be made from the same material as that of the gate insulating film 121 of the semiconductor storage unit 1, or may be made from a different material. However, the gate insulating film 121 and the gate insulating film 221 are preferably made from the same material (a silicon oxide film containing carbon atoms of 0.1 to 5.0 atomic percent, with the same film thickness). In this case, since the same process can be commonly used for forming the gate insulating films, the number of processes can be reduced.

The semiconductor device 2 serving as a switching element may be used, for example, as a selection transistor to be placed for each of pixels in a display device, as transistors constituting a display driver, or as transistors constituting a logic circuit. Moreover, by installing the semiconductor storage unit 1 forming a non-volatile memory in a mixed manner, the semiconductor device of the present embodiment is allowed to exert higher functions and have a wider range of applications.

Since the diffusion layer regions of the semiconductor device 2 are provided with the regions 214, 215 having a low concentration of impurities formed between the regions 212, 213 having a high concentration of impurities and the channel region, hot carriers hardly occur upon operation of the transistor. Therefore, it becomes possible to prevent the transistor characteristics from fluctuating with time. Consequently, even in the case when the gate oxide film of the semiconductor device 2 contains carbon atoms of 0.1 to 5.0 atomic percent, it is possible to prevent them from giving adverse effects to the transistor operations. In order to form the semiconductor storage unit 1 and the semiconductor device 2 on the same insulating substrate, by using a patterned photoresist as a mask, injections of impurities for the regions 214 and 215 having a low concentration of impurities may be selectively carried out on the regions where the semiconductor device 2 is to be formed. In this manner, with the number of processes to be added being minimized, the switching element and the non-volatile memory element with high reliability can be easily installed in a mixed manner.

Figure 18:
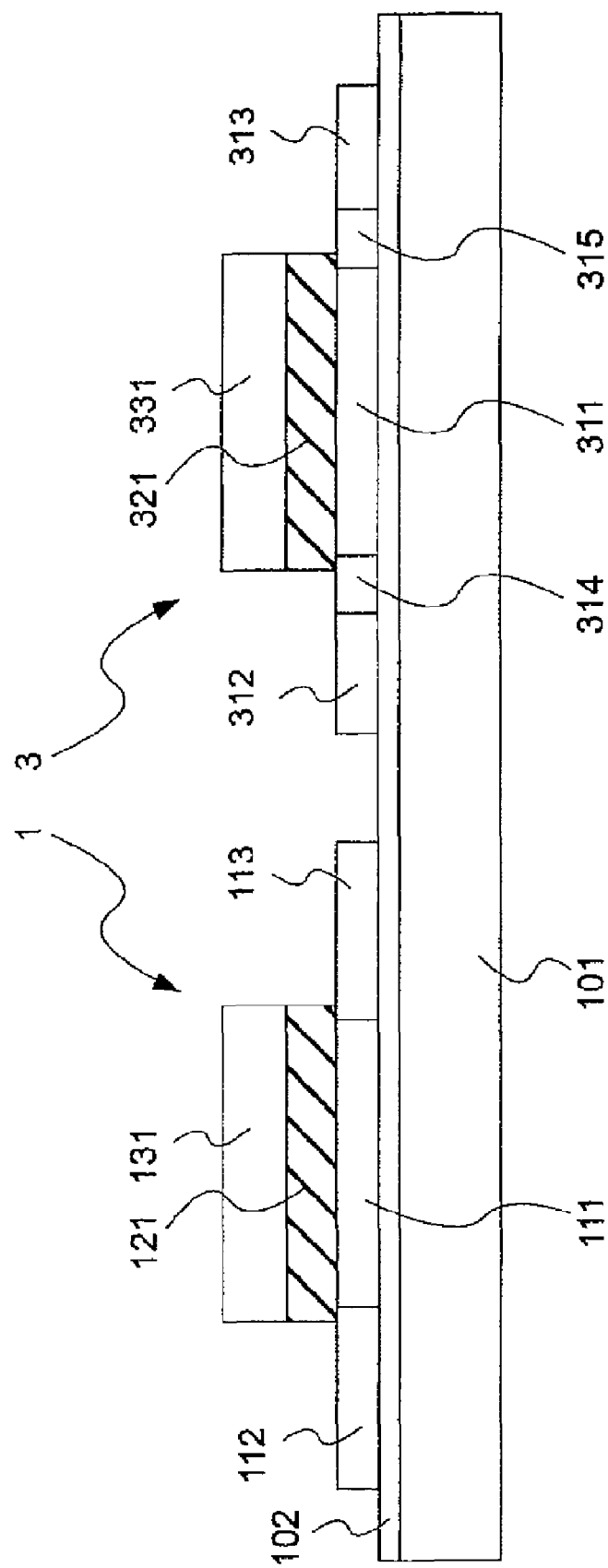
FIG. 18 is a schematic cross-sectional view that shows a modified example of the semiconductor storage unit in accordance with second Embodiment of the present invention.

FIG. 18 is a schematic cross-sectional view of a modified example of a semiconductor device of the present invention. The semiconductor device shown in FIG. 18 differs from the semiconductor device shown in FIG. 17 in that the regions 312 and 313 having a high concentration of impurities of the semiconductor device 3 serving as a switching element are offset from the gate electrode 331 (not overlapped therewith). With this structure also, since hot carriers hardly occur upon operation of the transistor, it becomes possible to prevent the transistor characteristics from fluctuating with time. In FIG. 18, reference numeral 311 represents a body region, 314 and 315 represent regions having a low concentration of impurities, 321 represents a gate insulating film and 331 represents a gate electrode.

Here, in the semiconductor device shown in FIG. 17, it is possible to provide a higher voltage resistance easily. In contrast, the semiconductor device shown in FIG. 18 makes it possible to provide a smaller electrostatic capacitance to each of the gate electrode and diffusion layer regions; therefore, this is advantageously used for achieving high-speed operations and low power consumption.

Third Embodiment

A display device in accordance with the third aspect of the present invention including: the non-volatile memory and the field effect transistor, that are formed on a panel substrate of the display device.

In accordance with the above-mentioned structure, since the semiconductor storage unit of the present invention is formed on the panel substrate of the display device, the cost of the externally added part and the attaching cost of the externally added part can be reduced. Moreover, since the adjustment can be automatically carried out easily, the inspection cost can be reduced. Furthermore, since the semiconductor storage unit of the present invention simplifies the structure of the gate insulating film and reduces the number of processes required, it is advantageous in cutting costs.

Third Embodiment of the present invention relates to a liquid crystal display provided with a semiconductor storage unit (non-volatile memory) as shown in first Embodiment. For example, JP-A No. 2000-19557 has proposed such a liquid crystal display provided with a semiconductor memory. In this Patent Publication, data to be gamma-corrected are stored in a memory element.

The liquid crystal display as shown in third Embodiment of the present invention is characterized by a display device having opposing electrodes that face pixel electrodes and a semiconductor storage unit shown in first Embodiment formed on a panel substrate of this liquid crystal display. In this case, the semiconductor storage unit is utilized as an element that stores image information to be supplied to a voltage generating circuit for applying a voltage to the opposing electrodes of the liquid crystal display.

Figure 19:
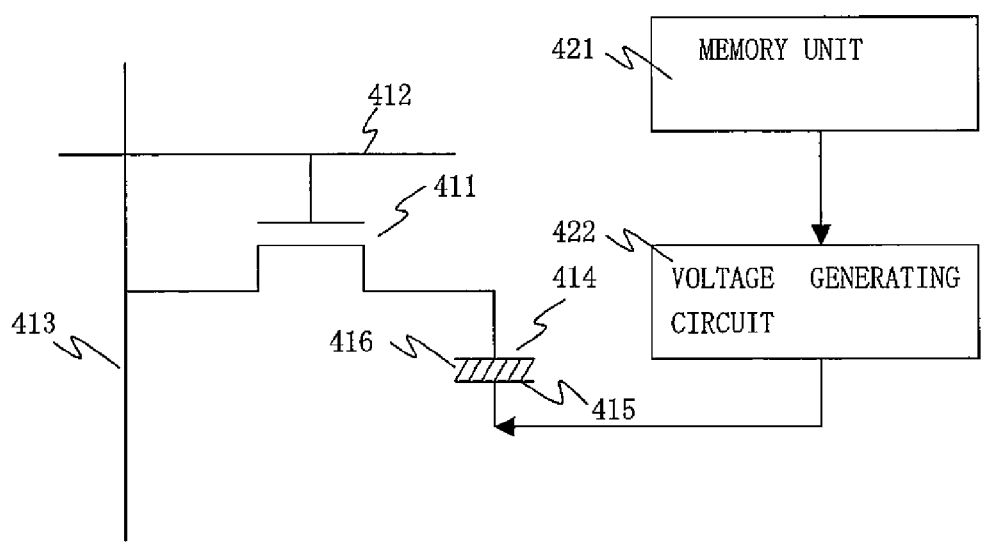
FIG. 19 is a block diagram that shows a liquid crystal display in accordance with third Embodiment of the present invention.

More specifically, as shown in FIG. 19, a signal line 412 is connected to the gate electrode of a pixel TFT 411, and a signal line 413 is connected to one of the diffusion layer regions of the pixel TFT 411, with a pixel electrode 414 being connected to the other diffusion layer region. The pixel electrode 414 is placed face to face with an opposing electrode 415 commonly used in the panel, with liquid crystal 416 interposed therebetween. A predetermined voltage generated by the voltage generating circuit 422 is applied to the opposing electrode 415. The voltage to be generated by the voltage generating circuit 422 is determined based upon image information stored in a memory unit 421 provided with the semiconductor storage unit (non-volatile memory) of the present invention.

The voltage to be generated in the voltage generating circuit 422, which is applied to the opposing electrode 415 so as to suppress flickering of the screen, needs to be adjusted for each panel. This voltage adjustment is generally carried out by adjusting a variable resistor externally added to the panel. By using the semiconductor storage unit (non-volatile memory) of third Embodiment of the present invention, the cost of the externally added part and the attaching cost of the externally added part can be reduced. Moreover, since the adjustment can be automatically carried out easily, the inspection cost can be reduced. Furthermore, since the semiconductor storage unit (non-volatile memory) of the present invention simplifies the structure of the gate insulating film and reduces the number of processes required, it is advantageous in cutting costs.

Fourth Embodiment

A liquid crystal display in accordance with the forth aspect of the present invention, provided with a pixel electrode and an opposing electrode, including: a voltage output circuit which, upon input of digital information, outputs a voltage determined by the digital information to the opposing electrode; a DA converter that converts digital gradation data to an analog gradation signal; and a storage circuit used for storing data that define a correlation between voltages of the digital gradation data and the analog gradation signal, wherein each of the voltage output circuit and the DA converter comprises the field effect transistor formed on the panel substrate of the liquid crystal display device, and the storage circuit comprises the semiconductor storage unit formed on the panel substrate of the liquid crystal display device.

In accordance with the above-mentioned structure, since the semiconductor storage unit of the present invention is formed on the panel substrate of the liquid crystal display, the cost of the externally added part and the attaching cost of the externally added part can be reduced. Moreover, since the adjustment can be automatically carried out easily, the inspection cost can be reduced. Furthermore, since the semiconductor storage unit of the present invention simplifies the structure of the gate insulating film and reduces the number of processes required, it is advantageous in cutting costs.

Fourth Embodiment of the present invention relates to a display device provided with a semiconductor storage unit (non-volatile memory) and a semiconductor device (TFT) as shown in second Embodiment. For example, a liquid crystal panel, an organic EL panel or the like may be used as the display device.

This display device has a structure in which a voltage output circuit which, upon input of digital information, outputs a voltage determined by the digital information to the opposing electrode, and a DA converter which converts digital gradation data to an analog gradation signal are further formed on the panel substrate, and data that defines the correlation between the voltages of the digital gradation data and the analog gradation signal are stored in the semiconductor storage unit of the above-mentioned first Embodiment.

Figure 20:
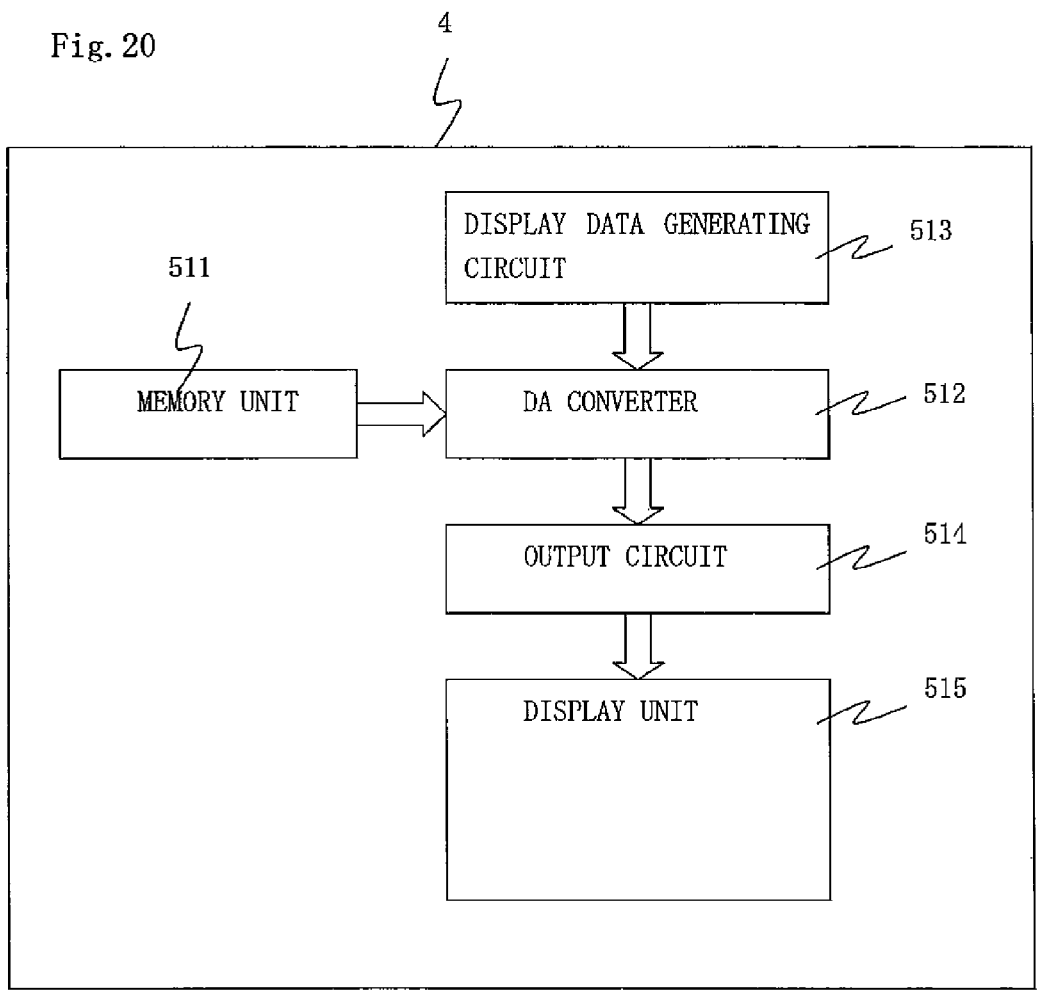
FIG. 20 is a circuit block diagram of a display device in accordance with fourth Embodiment of the present invention.

More specifically, as shown in FIG. 20, the display device 4 is provided with a display data generating circuit 513, which sends display data prepared as a digital signal to the DA converter 512. The DA converter 512 converts the display data as the digital signal to an analog signal, and sends the signal to the display unit 515 through an output circuit 514. At this time, it is necessary to adjust the correlation between the voltages of the digital gradation data and analog gradation signal in the DA converter 512 so as to naturally reproduce colors of an image to be displayed on the display unit. The correlation needs to be adjusted for each panel. The correlation between the voltages of the digital gradation data and analog gradation signal is stored in the memory unit 511 provided with the semiconductor storage unit (non-volatile memory) of the present invention.

The correlation between the voltages of the digital gradation data and the analog gradation signal is generally stored in a non-volatile memory chip externally added to the panel. By using the semiconductor storage unit (non-volatile memory) of the present invention, the cost of the externally added part and the attaching cost of the externally added part can be reduced. Moreover, since the adjustment can be automatically carried out easily, the inspection cost can be reduced. Furthermore, since the semiconductor storage unit (non-volatile memory) of the present invention simplifies the structure of the gate insulating film and reduces the number of processes required, it is advantageous in cutting costs.

Fifth Embodiment

An image receiving apparatus in accordance with the fifth aspect of the present invention including: a display device; a receiving circuit for receiving an image signal; an image signal circuit that supplies the image signal received by the receiving circuit to the display device; and a storage circuit that stores data required for generating the image signal, wherein each of the receiving circuit and the image signal circuit includes the field effect transistor formed on the panel substrate of the liquid crystal display device, and the storage circuit includes the semiconductor storage unit formed on the panel substrate of the display device.

In accordance with the above-mentioned structure, since the display device on which the semiconductor storage unit of the present invention is formed is installed therein, it becomes possible to achieve a highly functional image receiving apparatus at low costs.

Fifth Embodiment of the present invention relates to an image receiving apparatus that is provided with a display device having a semiconductor storage unit (non-volatile memory) and a semiconductor device (TFT) as shown in second Embodiment, and has a structure in which a receiving circuit for receiving an image signal, an image signal circuit used for supplying the image signal received by the receiving circuit to the display device and the semiconductor storage unit used for storing data required for generating the image signal are formed on the display device and the panel substrate of the display device.

Figure 21:
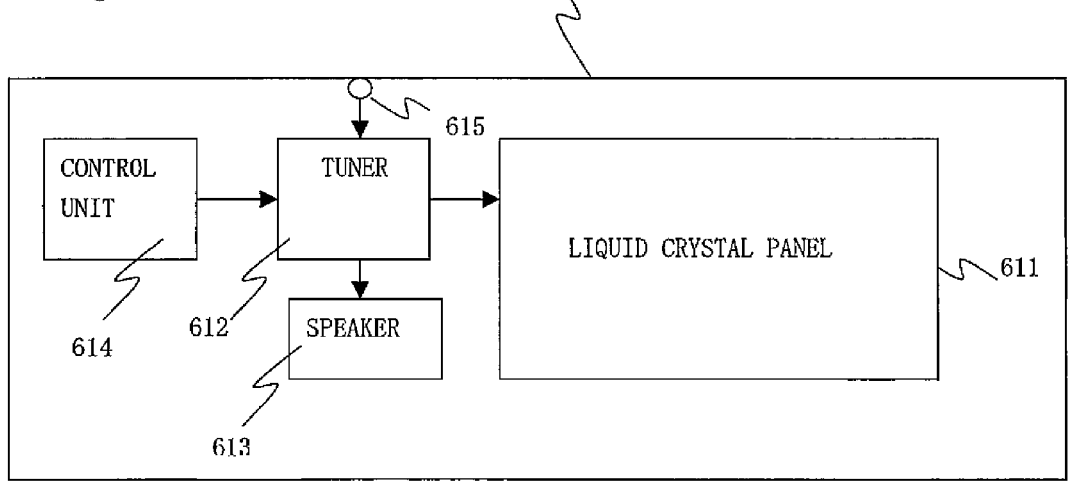
FIG. 21 is a structural drawing of an image receiving apparatus in accordance with fifth Embodiment of the present invention.
Figure 22:
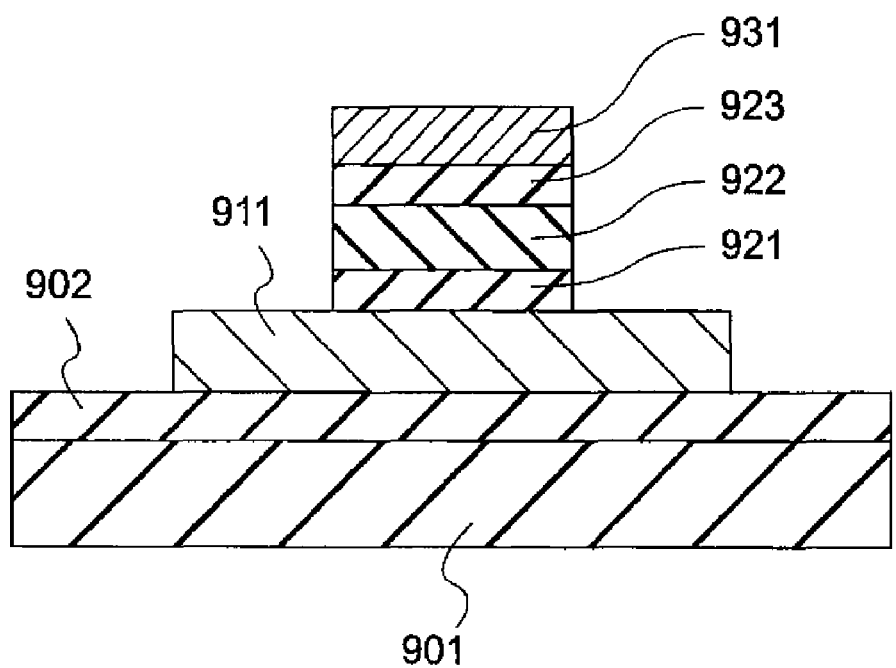
FIG. 22 is a schematic cross-sectional view that shows a non-volatile memory of a conventional art.

More specifically, as shown in FIG. 21, an image receiving apparatus 5 is provided with a display device (liquid crystal display panel) 611, a tuner 612, a speaker 613, a control unit 614 and an antenna terminal 615. FIG. 21 shows a system that receives a radio signal by an antenna; however, in the case of receiving a signal through a cable, the antenna terminal is replaced by a cable connecting terminal, and the tuner is replaced by a signal receiving unit. The display device 611 is provided with the semiconductor storage unit (non-volatile memory) of the present invention. The non-volatile memory, placed on the display device 611, can store data such as a voltage value to be applied to the opposing electrode of the liquid crystal panel and the correlation between voltages of the digital gradation data and the analog gradation signal. Here, a coded signal is sent to the display device, and by encoding the code in the display panel, information security can be enhanced, and in this case, the key of the code can be stored in the semiconductor storage unit installed in the display device. Thus, by installing this display device in an image receiving apparatus, it becomes possible to achieve a highly functional image receiving apparatus at low costs.

What is claimed is:

1. A semiconductor storage unit comprising: a semiconductor layer; two diffusion layer regions forming a source region and a drain region, which are formed in the semiconductor layer; a channel region fixed between the two diffusion layer regions: a gate insulating film that is formed on the channel region, and made of a silicon oxide film containing carbon atoms of 0.1 to 5.0 atomic percent; and a gate electrode formed on the gate insulating film.

2. The semiconductor storage unit according to claim 1, wherein the two diffusion layer regions are P-type conductive regions and a current flowing between the two diffusion layer regions is reduced by accumulating holes in the gate insulating film.

3. The semiconductor storage unit according to claim 1, wherein the two diffusion layer regions are N-type conductive regions and by applying a reference voltage to one of the diffusion layer regions, with a voltage higher than the reference voltage being applied to the other diffusion layer region and a voltage higher than the reference voltage being applied to the gate electrode, electrons are locally injected into the gate insulating film on the other diffusion region side so as to reduce a current flowing between the two diffusion layer regions.

4. The semiconductor storage unit according to claim 1, wherein the two diffusion layer regions are P-type conductive regions and by applying a reference voltage to one of the diffusion layer regions, with a voltage lower than the reference voltage being applied to the other diffusion layer region and a voltage lower than the reference voltage being applied to the gate electrode, holes are locally injected into the gate insulating film on the other diffusion region side so as to reduce a current flowing between the two diffusion layer regions.

5. The semiconductor storage unit according to claim 1, wherein the two diffusion layer regions are N-type conductive regions and by applying a reference voltage to one of the diffusion layer regions, with a voltage higher than the reference voltage being applied to the other diffusion layer region and a voltage lower than the reference voltage being applied to the gate electrode, holes are locally injected into the gate insulating film on the other diffusion region side so as to increase a current flowing between the two diffusion layer regions.

6. The semiconductor storage unit according to claim 5, wherein the semiconductor layer has a body region placed between the two diffusion layers, with a voltage lower than the reference voltage being applied to the body region.

7. The semiconductor storage unit according to claim 1, wherein the two diffusion layer regions are P-type conductive regions 5 and by applying a reference voltage to one of the diffusion layer regions, with a voltage lower than the reference voltage being applied to the other diffusion layer region and a voltage higher than the reference voltage being applied to the gate electrode, electrons are locally injected into the gate insulating film on the other diffusion region side so as to increase a current flowing between the two diffusion layer regions.

8. The semiconductor storage unit according to claim 7, wherein the semiconductor layer has a body region placed between the two diffusion layers, with a voltage higher than the reference voltage being applied to the body region.

9. The semiconductor storage unit according to claim 1, wherein a reading process is carried out, while one of the diffusion regions is used as a source, with the other diffusion region being used as a drain.

10. The semiconductor storage unit according to claim 1, wherein charges are independently injected to the gate insulating film on a side closer to one of the diffusion regions and to the gate insulating film on a side closer to the other diffusion region respectively so that information of two bits is stored.

11. The semiconductor storage unit according to claim 1, wherein the semiconductor layer is formed on an insulating substrate.

* * * * *